US010644029B1

(12) United States Patent
Park et al.

(10) Patent No.: US 10,644,029 B1
(45) Date of Patent: May 5, 2020

(54) SEMICONDUCTOR DEVICE AND METHOD OF FABRICATING THE SAME

(71) Applicant: SK hynix Inc., Incheon-si, Gyeonggi-do (KR)

(72) Inventors: In Su Park, Icheon-si (KR); Dong Sun Sheen, Seongnam-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/721,740

(22) Filed: Dec. 19, 2019

Related U.S. Application Data

(63) Continuation of application No. 15/972,395, filed on May 7, 2018, now Pat. No. 10,559,589.

(30) Foreign Application Priority Data

Sep. 25, 2017 (KR) ........................ 10-2017-0123410

(51) Int. Cl.
| | |
|---|---|
| *G11C 16/14* | (2006.01) |
| *H01L 27/11582* | (2017.01) |
| *H01L 29/08* | (2006.01) |
| *H01L 23/522* | (2006.01) |
| *G11C 16/04* | (2006.01) |
| *H01L 29/10* | (2006.01) |
| H01L 21/28 | (2006.01) |
| H01L 21/311 | (2006.01) |
| H01L 21/02 | (2006.01) |
| G11C 16/34 | (2006.01) |
| G11C 16/26 | (2006.01) |

(52) U.S. Cl.
CPC .... *H01L 27/11582* (2013.01); *G11C 16/0483* (2013.01); *H01L 23/5226* (2013.01); *H01L 29/0847* (2013.01); *H01L 29/1037* (2013.01); *H01L 29/1095* (2013.01); *G11C 16/0466* (2013.01); *G11C 16/14* (2013.01); *G11C 16/26* (2013.01); *G11C 16/3445* (2013.01); *G11C 16/3459* (2013.01); *H01L 21/0217* (2013.01); *H01L 21/02164* (2013.01); *H01L 21/31111* (2013.01); *H01L 29/40117* (2019.08)

(58) Field of Classification Search
CPC .......... H01L 27/11582; G11C 16/0483; G11C 16/14; G11C 16/26; G11C 16/3445
USPC ........................................ 365/185.01–185.33
See application file for complete search history.

(56) References Cited

U.S. PATENT DOCUMENTS

| | | | |
|---|---|---|---|
| 5,923,587 A | 7/1999 | Choi | |
| 6,849,895 B2 * | 2/2005 | Osabe | .................... B82Y 10/00 257/311 |

(Continued)

FOREIGN PATENT DOCUMENTS

| | | |
|---|---|---|
| KR | 1020160020210 A | 2/2016 |
| KR | 1020170065290 A | 6/2017 |

*Primary Examiner* — Harry W Byrne
(74) *Attorney, Agent, or Firm* — William Park & Associates Ltd.

(57) ABSTRACT

Provided herein may be a semiconductor device and a method of manufacturing the same. The semiconductor device may include a memory string including memory cells coupled to each other in series via a channel layer, the memory string coupled between a bit line and a second source line. The semiconductor device may include a first source line electrically coupled to the second source line through the channel layer.

11 Claims, 12 Drawing Sheets

(56) References Cited

U.S. PATENT DOCUMENTS

| | | | |
|---|---|---|---|
| 7,294,880 B2 * | 11/2007 | Osabe | B82Y 10/00 257/311 |
| 7,939,879 B2 * | 5/2011 | Osabe | B82Y 10/00 257/311 |
| 8,278,700 B2 * | 10/2012 | Osabe | B82Y 10/00 257/311 |
| 9,251,910 B2 | 2/2016 | Kim et al. | |
| 10,147,731 B2 | 12/2018 | Cha | |
| 2002/0113257 A1 * | 8/2002 | Osabe | B82Y 10/00 257/296 |
| 2005/0052939 A1 * | 3/2005 | Osabe | B82Y 10/00 365/232 |
| 2008/0042193 A1 * | 2/2008 | Osabe | B82Y 10/00 257/325 |
| 2011/0169070 A1 * | 7/2011 | Osabe | B82Y 10/00 257/324 |
| 2012/0319187 A1 * | 12/2012 | Osabe | B82Y 10/00 257/324 |
| 2015/0221389 A1 | 8/2015 | Kim et al. | |
| 2015/0263016 A1 | 9/2015 | Cha | |
| 2016/0351581 A1 | 12/2016 | Ahn | |
| 2018/0006047 A1 | 1/2018 | Cha | |

* cited by examiner

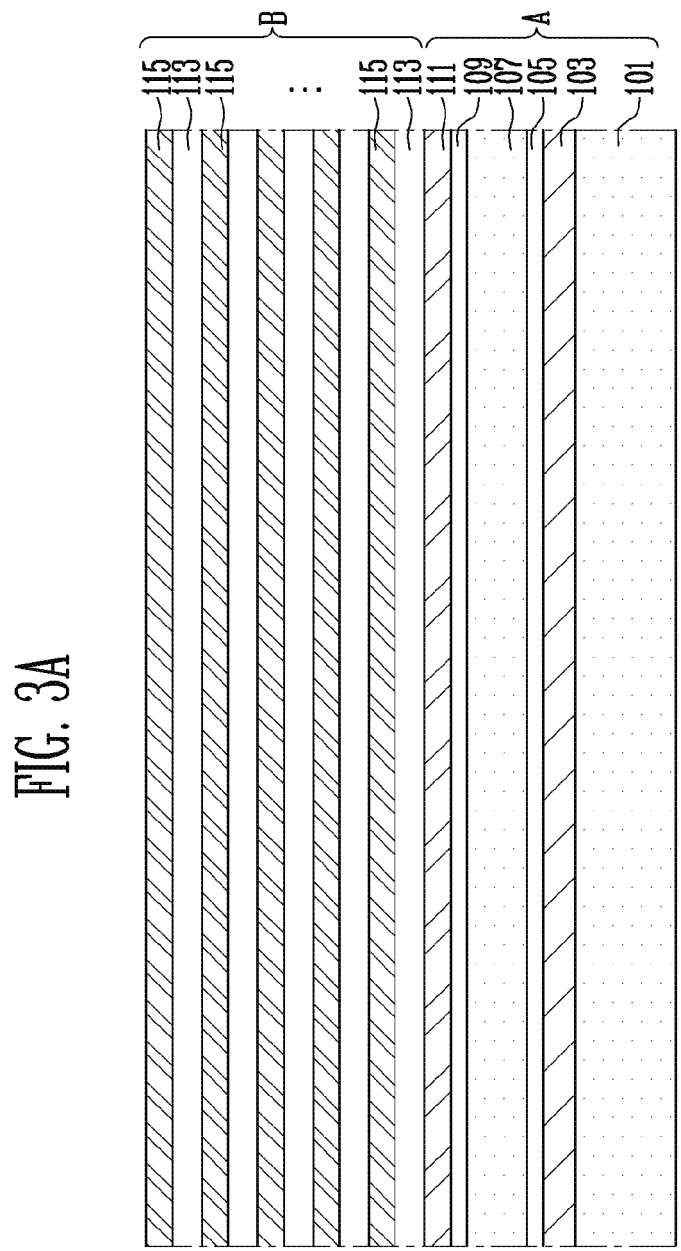

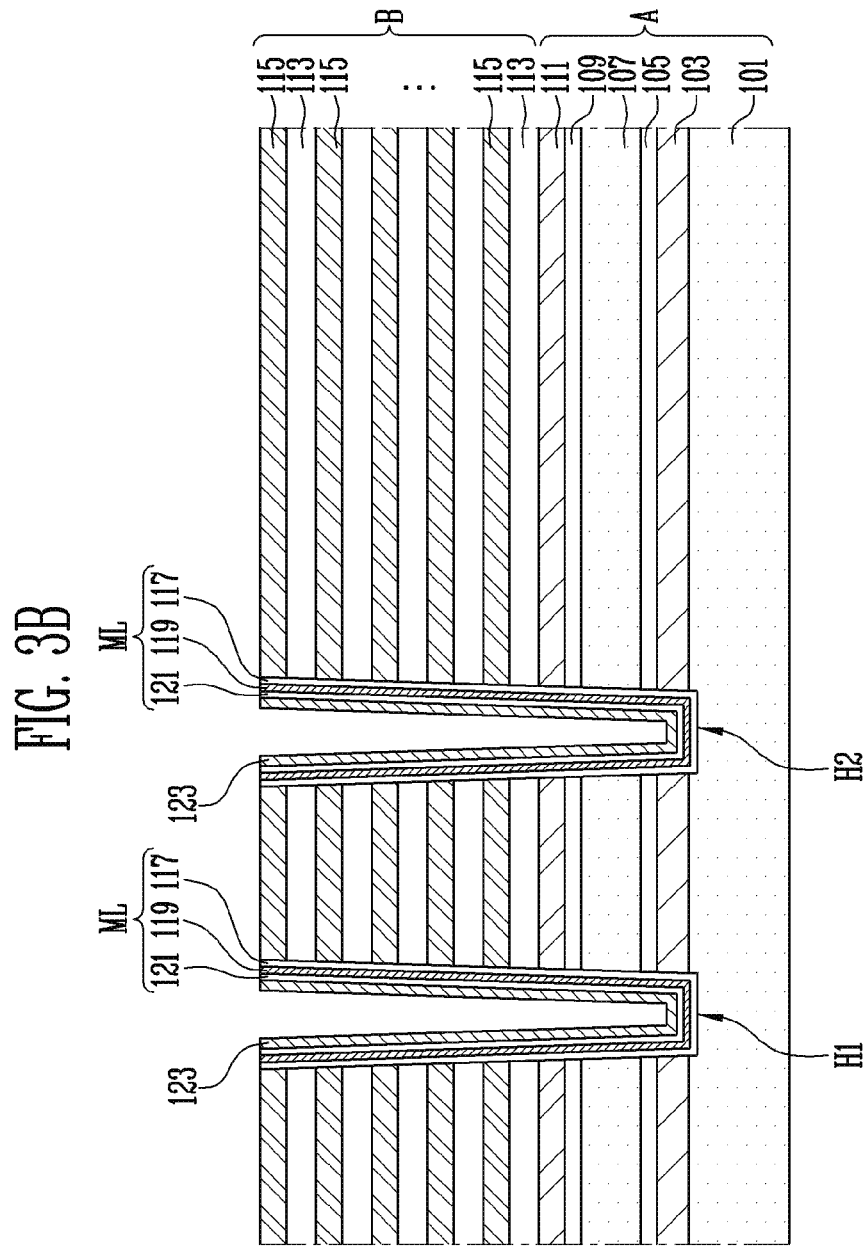

SEMICONDUCTOR DEVICE AND METHOD OF FABRICATING THE SAME

CROSS-REFERENCE TO RELATED APPLICATION

The present application is a continuation application of U.S. patent application Ser. No. 15/972,395, filed on May 7, 2018, and claims priority under 35 U.S.C. § 119(a) to Korean patent application number 10-2017-0123410 filed on Sep. 25, 2017 in the Korean Intellectual Property Office, the entire disclosure of which is incorporated herein by reference.

BACKGROUND

1. Technical Field

Various embodiments of the present disclosure generally relate to a semiconductor device and a method of fabricating the same, and more particularly, to a three-dimensional semiconductor memory device and a method of fabricating the same.

2. Related Art

A semiconductor device includes a plurality of memory cell transistors capable of storing data. The memory cell transistors may be coupled in series between select transistors, thus forming a memory string. To embody high integration of a semiconductor device, a three-dimensional semiconductor device has been proposed. Gate electrodes of the memory cell transistors and the select transistors may be stacked on a substrate to form the three-dimensional semiconductor device. The three-dimensional semiconductor device further includes a channel layer passing through the gate electrodes. With regard to the realization of such a three-dimensional semiconductor device, various techniques for improving the operational reliability of the semiconductor device are being developed.

SUMMARY

An embodiment of the present disclosure may provide for a semiconductor device. The semiconductor device may include a well plate. The semiconductor device may include a separation layer disposed on the well plate. The semiconductor device may include an auxiliary source line layer disposed on the separation layer and spaced apart from the well plate. The semiconductor device may include a stack structure formed on the auxiliary source line layer. The semiconductor device may include channel layers configured to pass through the stack structure, and electrically coupled to the well plate and the auxiliary source line layer.

An embodiment of the present disclosure may provide for a method of manufacturing a semiconductor device. The method may include successively stacking and forming, on a semiconductor substrate, a first conductive layer for a first source line, a separation layer, a sacrificial layer, an etch stop layer and a plurality of first and second material layers. The method may include etching the first material layers, the second material layers, the etch stop layer, the sacrificial layer and the separation layer and forming a plurality of channel holes through which portions of the first conductive layer are exposed. The method may include forming channel plugs by successively stacking a multilayer layer and a channel layer on inner sidewalls of the channel holes. The method may include etching a bottom of each of the channel holes to expose the first conductive layer, and additionally forming the channel layer on the bottom of each of the channel holes such that the first conductive layer comes into contact with the channel layer. The method may include etching the first material layers, the second material layers, the etch stop layer and forming a second source contact hole through which the sacrificial layer is exposed. The method may include exposing a portion of a sidewall of a lower portion of each of the channel plugs by removing the exposed sacrificial layer. The method may include exposing a portion of the channel layer by removing the multilayer layer of the exposed lower portion of each of the channel plugs, and filling a region from which the sacrificial layer has been removed with a second conductive layer for a second source line such that the second conductive layer comes into contact with the channel layer.

An embodiment of the present disclosure may provide for a semiconductor device. The semiconductor device may include a memory string including memory cells coupled to each other in series via a channel layer, the memory string coupled between a bit line and a second source line. The semiconductor device may include a first source line electrically coupled to the second source line through the channel layer.

BRIEF DESCRIPTION OF THE DRAWINGS

FIGS. 3A to 3H are sectional views illustrating a method of manufacturing a semiconductor device in accordance with an embodiment of the present disclosure.

DETAILED DESCRIPTION

Figure 1:
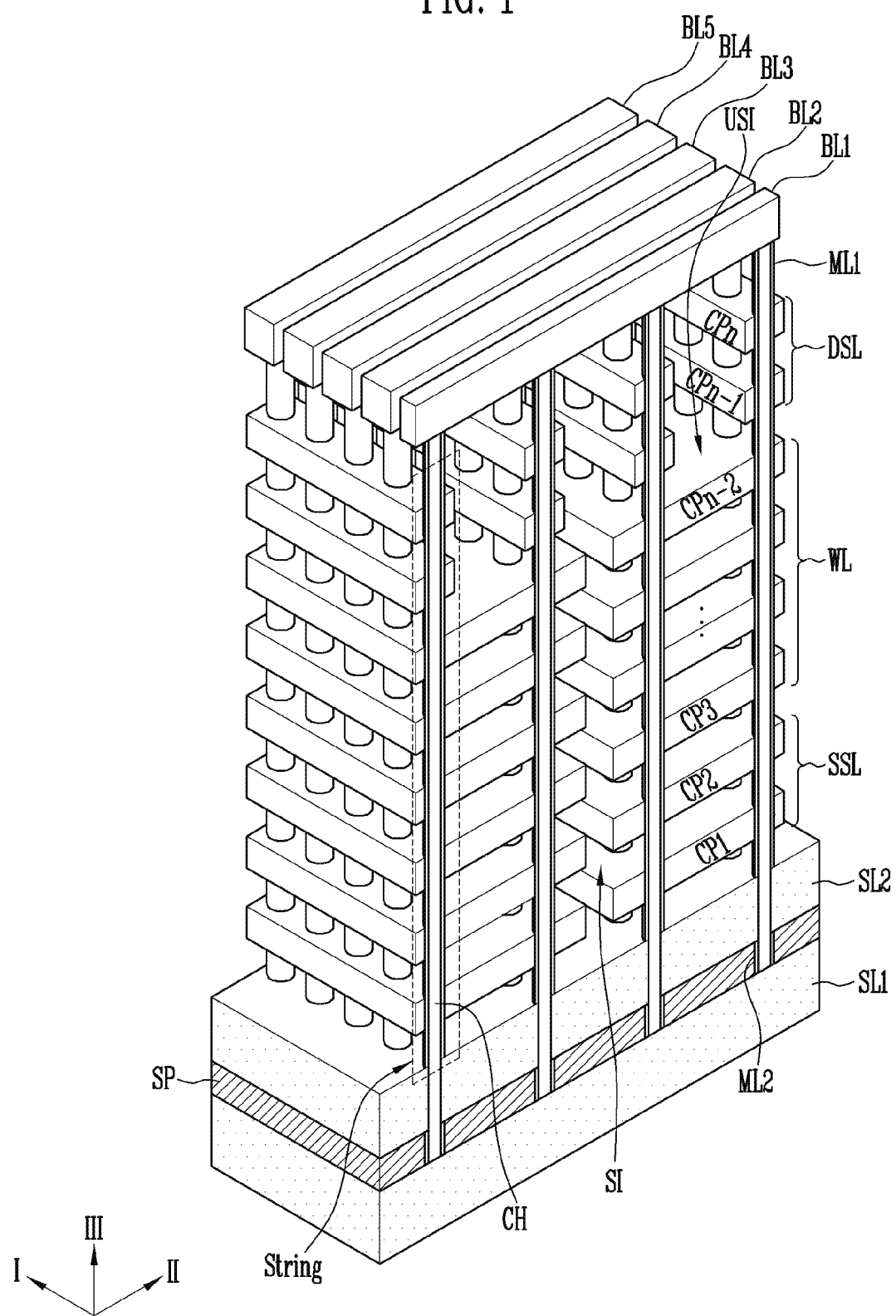
FIG. 1 is a perspective view illustrating memory strings of a semiconductor device in accordance with an embodiment of the present disclosure.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a three-dimensional semiconductor device which has improved operational reliability, and a method of fabricating the same.

FIG. 1 is a perspective view illustrating memory strings of a semiconductor device in accordance with an embodiment of the present disclosure. Referring to FIG. 1, to schematically illustrate the structure of the semiconductor device according to an embodiment of the present disclosure, the illustration of interlayer insulating layers has been omitted.

The semiconductor device according to an embodiment of the present disclosure may include a three-dimensional memory string String. The three-dimensional memory string String may have a straight type, as illustrated in FIG. 1.

A straight memory string String may include memory cells and select transistors which are stacked along a straight channel layer CH. Gates of the memory cells and gates of the select transistors may be coupled to conductive patterns CP1 to Cpn.

The channel layer CH may be formed in the form of a tube which encloses an insulating pillar with which a central region of a straight hole is filled, or may be formed such that the central region of the straight type hole is completely filled therewith.

An upper end of the channel layer CH may be electrically coupled to a corresponding one of bit lines BL1 to BL5. In an embodiment, there is illustrated five bit lines, but the present disclosure is not limited thereto, and more or less bit lines may be disposed. The bit lines BL1 to BL5 may extend in a second direction II. A drain contact plug (not illustrated) may be further formed between each of the bit lines BL1 to BL5 and the corresponding channel layer CH.

Channel layers CH may be substantially parallel to each other and each may be coupled to a well plate SL1 and an auxiliary source line layer SL2. The well plate SL1 and the auxiliary source line layer SL2 may be respectively defined as a first source line layer and a second source line layer. The first source line layer SL1 may be formed on a semiconductor substrate, and the second source line layer SL2 may be formed over the first source line layer SL1. A separation layer SP is formed at the interface between the first source line layer SL1 and the second source line layer SL2 and electrically and physically separates the first source line layer SL1 from the second source line layer SL2. A side surface of a lower end of each channel layer CH may be coupled to the second source line layer SL2, and the bottom of the lower end of the channel layer CH may be coupled to the first source line layer SL1. The channel layer CH may pass through the second source line layer SL2 and be coupled to the first source line layer SL1. In other words, the second source line layer SL2 may enclose the channel layer CH.

The first source line layer SL1 may be formed of a doped polysilicon layer doped with a P-type impurity. The second source line layer SL2 may be formed of an undoped polysilicon layer or a doped polysilicon layer doped with an N-type impurity. The lower end of the channel layer CH may be coupled to the first source line layer SL1 and the second source line layer SL2, and extend in a third direction III toward the bit lines BL1 to BL5.

Although not illustrated, the first source line layer SL1 and the second source line layer SL2 may be respectively coupled to a first source contact plug and a second source contact plug and thus may be respectively coupled to a first common source line and a second common source line. In other words, the first source line layer SL1 and the second source line layer SL2 may be respectively coupled to the first common source line and the second common source line that are electrically separated from each other.

A side surface of the channel layer CH may be generally enclosed by a multilayer layer ML. In an embodiment, for example, a side surface of the channel layer CH may be enclosed by first and second multilayer patterns ML1 and ML2. In an embodiment, for example, a side surface of the channel layer CH may be enclosed by one or more multiplayer patterns. The portion of the channel layer CH that comes into contact with the second source line layer SL2 may not be enclosed by a multilayer layer, whereby the channel layer CH may come into direct contact with the second source line layer SL2.

An outer surface of the channel layer CH may be enclosed by the first multilayer pattern ML1, or be enclosed by the second multilayer pattern ML2. Each of the first multilayer pattern ML1 and the second multilayer pattern ML2 may include a tunnel insulating layer, a data storage layer and a blocking insulating layer. The first multilayer pattern ML1 is formed to enclose a side surface of a portion of the channel layer CH over the portion of the channel layer CH that comes into contact with the second source line layer SL2. The second multilayer pattern ML2 is formed to enclose a side surface of a portion of the channel layer CH under the portion of the channel layer CH that comes into contact with the second source line layer SL2. The first multilayer pattern ML1 and the second multilayer pattern ML2 may be separated from each other with the second source line layer SL2 interposed therebetween.

The conductive patterns CP1 to CPn may be disposed in n layers spaced apart from each other between the bit lines BL1 to BL5 and the second source line layer SL2. The conductive patterns CP1 to CPn may enclose the channel layer CH and be stacked and spaced apart from each other. The conductive patterns CP1 to CPn may include a source select line SSL, word lines WL and a drain select line DSL. The source select line SSL may be disposed over the second source line layer SL2. The word lines WL may be disposed over the source select line SSL. The drain select line DSL may be disposed over the word lines WL. The conductive patterns CP1 to CPn may be separated into a plurality of sub-structures by a slit SI.

The source select line SSL may be disposed to have a single layered or two or more layered structure below the word lines WL. Although, in the drawing, there is illustrated an example in which the source select line SSL is formed both of a first pattern CP1 that is disposed in a lowermost layer of the conductive patterns CP1 to CPn and of a second pattern CP2 disposed over the first pattern CP1, the present disclosure is not limited to this.

The drain select line DSL may be disposed to have a single layered or two or more layered structure over the word lines WL. Although, in the drawing, there is illustrated an example in which the drain select line DSL is formed both of an n-th pattern CPn that is disposed in an uppermost layer of the conductive patterns CP1 to CPn and of an n-1-th pattern CPn-1 disposed below the n-th pattern CPn, the present disclosure is not limited to this.

The conductive patterns CP1 to CPn may be separated from each other by the slit SI. Either the source select line SSL or the drain select line DSL may be separated into unit lines smaller than that of the word lines WL. For example, the channel layers CH that are enclosed in common by each word line WL may be separated into a first group and a second group which are respectively enclosed by drain select lines DSL that are separated from each other. In this case, the drain select line DSL may be separated not only by the slit SI but also by an upper slit USI so that the width thereof is less than that of each of the word lines WL.

The memory cells are formed at intersections between the channel layer CH and the word lines WL, a drain select transistor is formed at an intersection between the channel layer CH and the drain select line DSL, and a source select transistor is formed at an intersection between the channel layer CH and the source select line SSL. The source select transistor, the memory cells and the drain select transistor that are arranged in a line along the single channel layer CH are coupled in series to each other through the channel layer CH and thus define a straight memory string String. The word lines WL may transmit signals to the gates of the memory cells. The source select line SSL may transmit a signal to a gate of the source select transistor. The drain select line DSL may transmit a signal to a gate of the drain select transistor.

Figure 2:
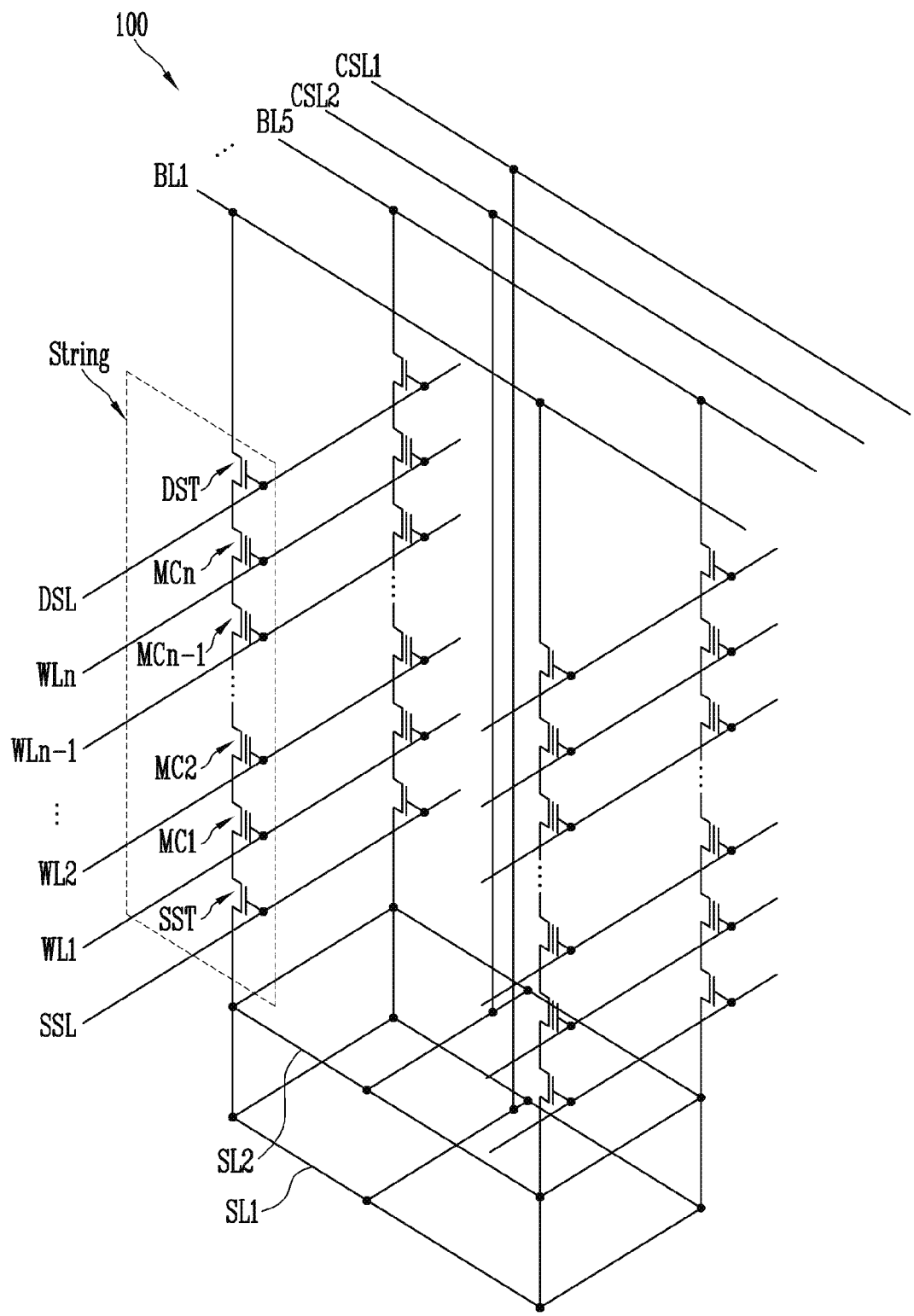
FIG. 2 is a circuit diagram illustrating memory strings of a semiconductor device in accordance with an embodiment of the present disclosure.

FIG. 2 is a circuit diagram illustrating memory strings of a semiconductor device in accordance with an embodiment of the present disclosure.

Referring to FIG. 2, the semiconductor device according to an embodiment of the present disclosure may include a memory cell array 100 having a three-dimensional structure. The memory cell array 100 includes a plurality of memory strings String. Each of the memory strings String may include a source select transistor SST, a plurality of memory cell transistors MC1 to MCn and a drain select transistor DST that are coupled in series to each other. The number of source select transistors SST or the number of drain select transistors DST that are coupled to each of the memory strings String may be two or more without being limited to one.

The memory strings String may be arranged in a matrix form in a row direction and a column direction. The memory strings String may be coupled on a column basis to the bit lines BL1 to BL5 extending in the column direction. The memory strings String may be coupled on a row basis to gate lines SSL, WL1 to WLn and DSL extending in the row direction.

The source select transistor SST, the plurality of memory cell transistors MC1 to MCn, and the drain select transistor DST may be coupled in series to each other by the channel layer and form a single memory string String. The memory strings String may be disposed between the bit lines BL1 to BL5 and first and second source lines SL1 and SL2. The gate lines SSL, WL1 to WLn and DSL are stacked between the bit lines BL1 to BL5 and the first and second source lines SL1 to SL2, and are spaced apart from each other.

The gate lines may include a source select line SSL, word lines WL1 to WLn and a drain select line DSL. The source select line SSL is used as a gate electrode of the source select transistor SST. The word lines WL1 to WLn are used as gate electrodes of the memory cell transistors MC1 to MCn. The drain select line DSL is used as a gate electrode of the drain select transistor DST. The word lines WL1 to WLn are stacked and spaced apart from each other. The source select line SSL is disposed below the word lines WL1 to WLn. The drain select line DSL is disposed over the word lines WL1 to WLn. In other words, the word lines WL1 to WLn are disposed between the source select line SSL and the drain select line DSL.

The first source line SL1 and the second source line SL2 are disposed below the source select line SSL, and are coupled in parallel to the source select transistors SST of the memory strings String. Each of the bit lines BL1 to BL5 is coupled to the drain select transistor DST of the corresponding memory string String.

The memory strings String coupled in common to a single drain select line DSL are coupled to different bit lines BL1 to BL5. Therefore, when one drain select line DSL is selected and one of the bit lines BL1 to BL5 is selected, one of the memory strings String may be selected.

The first source line SL1 and the second source line SL2 are respectively electrically coupled to a first common source line CSL1 and a second common source line CSL2. During an erase operation of the semiconductor device, when an erase voltage is applied to the first common source line CSL1, the erase voltage is applied to the channel layers of the memory strings String through the first source line SL1. Furthermore, during a program verify operation or a read operation of the semiconductor device, when an operating voltage (e.g., a ground voltage) is applied to the second common source line CSL2, a path of current flowing from the channel layers of the memory strings String to the second source line SL2 and the second common source line CSL2 may be formed.

During the erase operation of the semiconductor device, the second source line SL2 and the second common source line CSL2 remain floating, and during the program verify operation or the read operation of the semiconductor device, the first source line SL1 and the first common source line CSL1 remain floating.

Whether the channel layer of each memory string String is electrically coupled to the first source line SL1 or the second source line SL2 may be determined depending on a signal to be applied to the source select line SSL.

During a program verify operation of the semiconductor device, the potentials of the channel layers of the memory strings String are precharged to a predetermined level through the bit lines BL1 to BL5, and an operating voltage (e.g., a ground voltage) is applied to the second common source line CSL2 and the second source line SL2. Thereafter, when a program verify voltage is applied to a selected word line of the word lines WL1 to WLn, and a pass voltage is applied to the other word lines, the memory cells coupled with the selected word line are turned on or off depending on a program state thereof. Consequently, the potential of the channel layer of each memory string String is maintained at a predetermined level, or is discharged to a low level by the path of current flowing through the second source line SL2 and the second common source line CSL2. Thereafter, the program verify operation is performed by measuring the potential levels or current of the bit lines BL1 to BL5.

During an erase verify operation, the potentials of the channel layers of the memory strings String are precharged to a predetermined level through the bit lines BL1 to BL5, and an operating voltage (e.g., a ground voltage) is applied to the second common source line CSL2 and the second source line SL2. Thereafter, when an erase verify voltage is applied to all of the word lines WL1 to WLn, the memory cells MC1 to MCn coupled to the word lines WL1 to WLn are turned on or at least one memory cell is turned off, depending on erase states of the memory cells MC1 to MCn. Consequently, the potential of the channel layer of each memory string String is maintained at a predetermined level, or is discharged to a low level by the path of current flowing through the second source line SL2 and the second common source line CSL2. Thereafter, the erase verify operation is performed by measuring the potential levels or current of the bit lines BL1 to BL5.

In the above description, the erase verify operation has been described as being simultaneously performed on the memory cells MC1 to MCn included in the memory strings String, but the present disclosure is not limited thereto. For example, in the same manner as that of the program verify operation, an erase verify voltage may be applied to a selected word line, and a pass voltage may be applied to the other word lines so that the erase verify operation may be performed on each of the memory cells MC1 to MCn.

During a read operation of the semiconductor device, the potentials of the channel layers of the memory strings String are precharged to a predetermined level through the bit lines BL1 to BL5, and an operating voltage (e.g., a ground voltage) is applied to the second common source line CSL2 and the second source line SL2. Thereafter, when a read voltage is applied to a selected word line of the word lines WL1 to WLn, and a pass voltage is applied to the other word lines, the memory cells coupled with the selected word line are turned on or off depending on a program state thereof. Consequently, the potential of the channel layer of each memory string String is maintained at a predetermined level, or is discharged to a low level by the path of current flowing through the second source line SL2 and the second common source line CSL2. Thereafter, the read operation is performed by measuring the potential levels or current of the bit lines BL1 to BL5.

During an erase operation, a voltage having a predetermined level is applied to the bit lines BL1 to BL5, and a turn-off voltage is applied to the drain select line DSL to turn off the drain select transistor DST, whereby the electrical coupling of the bit lines BL1 to BL5 to the memory strings String is interrupted.

Thereafter, while the word lines WL1 to WLn are floating, an erase voltage is applied to the first common source line CSL1 and the first source line SL1, and a turn-on voltage is applied to the source select line SSL to turn on the source select transistor SST so that the erase voltage is applied to the channel layers of the memory strings String. Thereafter, when a ground voltage is applied to the word lines WL1 to WLn, electrons charged in the memory cells MC1 to MCn are detrapped by difference in potential level between the channel layers and the word lines WL1 to WLn. Consequently, data programmed in the memory cells MC1 to MCn is erased.

As described above, in an embodiment of the present disclosure, during a program verify operation, an erase verify operation or a read operation, a current path is formed through the second common source line CSL2 and the second source line SL2. During an erase operation, an erase voltage is applied to the channel layers of the memory strings through the first common source line CSL1 and the first source line SL1. As described above, a source line is divided into the first source line SL1 and the second source line SL2 that are electrically and physically separated from each other. Therefore, the second source line SL2 for a program verify operation, an erase verify operation or a read operation may be formed of an N-type conductive layer, and the first source line SL1 for an erase operation may be formed of a P-type conductive layer, so that electrical characteristics of each operation may be improved.

FIGS. 3A to 3H are sectional views illustrating a method of manufacturing a semiconductor device according to an embodiment of the present disclosure.

Referring to FIG. 3A, a first stack structure A for forming a source line is formed on a substrate (not illustrated) including a lower structure.

For example, a first conductive layer 101, a separation layer 103, a first buffer layer 105, a sacrificial layer 107, a second buffer layer 109 and an etch stop layer 111 are successively stacked and formed on the substrate (not illustrated) including the lower structure.

The first conductive layer 101 may be a conductive layer for forming the first source line SL1 illustrated in FIG. 1, and be formed of a doped polysilicon layer. The separation layer 103 may be an insulating layer for electrically and physically separating the first conductive layer 101 from a second source line SL2 to be formed later, and be formed of a silicon oxide layer. The first buffer layer 105 may be a layer for preventing the separation layer 103 from being etched during a subsequent etching process, and be formed of a nitride layer. The sacrificial layer 107 may be a layer to secure a space for forming the second source line SL2 to be formed later, and be formed of an undoped poly layer. The second buffer layer 109 may be a layer for preventing the etch stop layer 111 from being damaged during a process of etching a multilayer layer on a sidewall of a channel to be formed later, and be formed of a silicon oxide layer.

Thereafter, a second stack structure B is formed on the first stack structure A.

For example, first material layers 113 and second material layers 115 are alternately stacked on the etch stop layer 111. The second material layers 115 may be formed of material different from that of the first material layers 113. For example, the first material layers 113 may be formed of insulating material for interlayer insulating layers, whereas the second material layers 115 may be formed of conductive material for conductive patterns.

Alternatively, the first material layers 113 may be formed of insulating material for interlayer insulating layers, and the second material layers 115 may be used as sacrificial layers and be formed of sacrificial insulating material having an etching selectivity different from that of the first material layers 113. In this case, the first material layers 113 may be formed of a silicon oxide layer, and the second material layers 115 may be formed of a silicon nitride layer. In the case where all of the first and second material layers 113 and 115 are formed of insulating material, etching processes for forming a channel hole or a slit may be facilitated.

Alternately, the first material layers 113 may be used as sacrificial layers and be formed of sacrificial conductive material having an etching selectivity different from that of the second material layers 115, whereas the second material layers 115 may be formed of conductive material for conductive patterns. In this case, the first material layers 113 may be formed of an undoped polysilicon layer, whereas the second material layers 115 may be formed of a doped polysilicon layer. In the case where all of the first and second material layers 113 and 115 are formed of conductive material, etching processes for forming a channel hole or a slit may be facilitated.

Referring to FIG. 3B, channel holes H1 and H2 passing through portions of the second stack structure B and the first stack structure A are formed. Each of the channel holes H1 and H2 may be formed such that portions of an upper surface of the first conductive layer 101 are exposed.

Thereafter, a multilayer layer ML and a channel layer 123 are sequentially formed along a sidewall and the bottom of each of the channel holes H1 and H2.

The multilayer layer ML may be formed by successively stacking a tunnel insulating layer 117, a data storage layer 119 and a blocking insulating layer 121. Thereafter, the channel layer 123 may be formed along the surface of the blocking insulating layer 121. The blocking insulating layer 121, the data storage layer 119, the tunnel insulating layer 117 may be formed to enclose the channel layer 123. The channel layer 123 may be formed such that a central region of each of the channel holes H1 and H2 is open.

The tunnel insulating layer 117 may be formed of an oxide layer. The data storage layer 119 may be formed of a nitride layer. The blocking insulating layer 121 may be formed of an oxide layer. The multilayer layer ML may be formed of an ONO structure (an oxide layer—a nitride layer—an oxide layer). Furthermore, each of oxide layers of the multilayer layer ML may be formed of a single oxide layer, or be formed of a structure in which different material layers including an oxide layer are stacked.

Figure 3C:
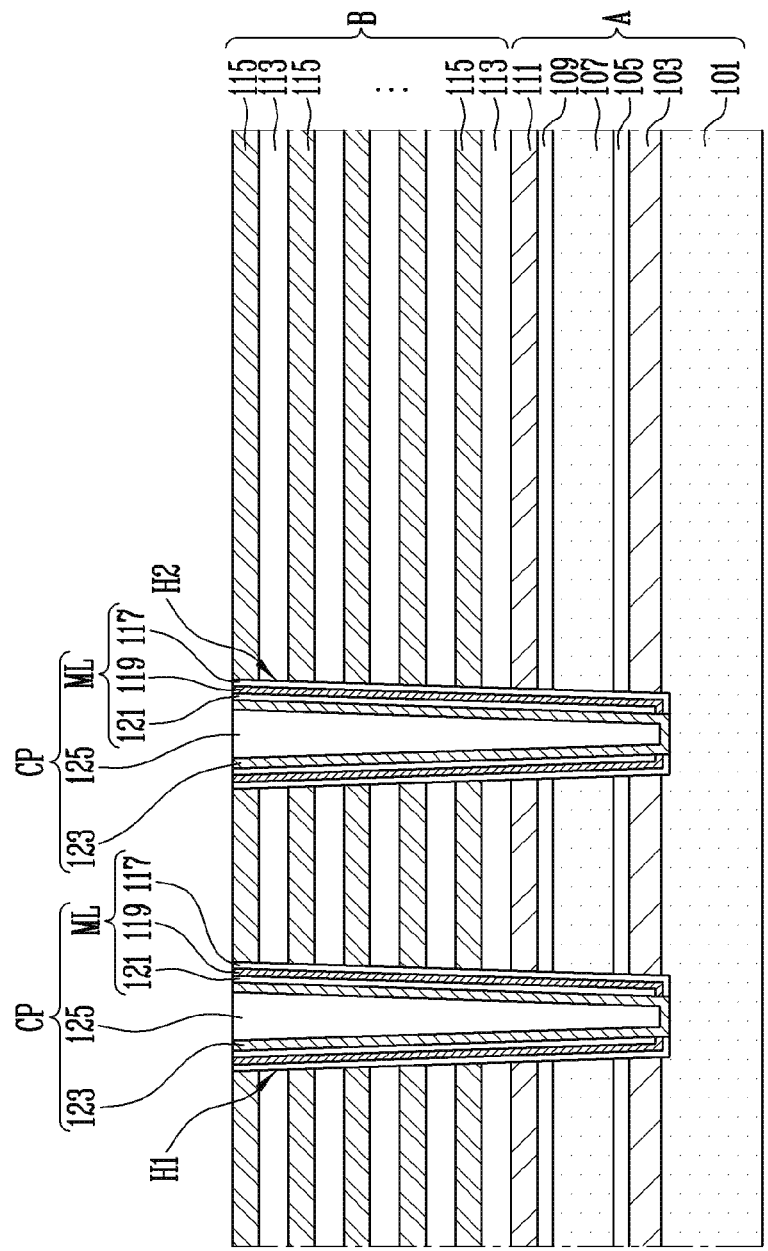

Referring to FIG. 3C, the channel layer 123 and the multilayer layer ML that are formed on the bottom of each of the channel holes H1 and H2 are removed through an etching process, whereby the first conductive layer 101 is exposed. Thereafter, an additional channel layer 123 is formed on the exposed first conductive layer 101 so that the channel layer 123 is electrically and physically coupled to the first conductive layer 101.

Thereafter, the central region of each of the opened channel holes H1 and H2 may be filled with a core insulating layer 125. As a result, channel plugs CP each of which are configured with the core insulating layer 125, the channel layer 123 and the multilayer layer ML are formed.

Figure 3D:
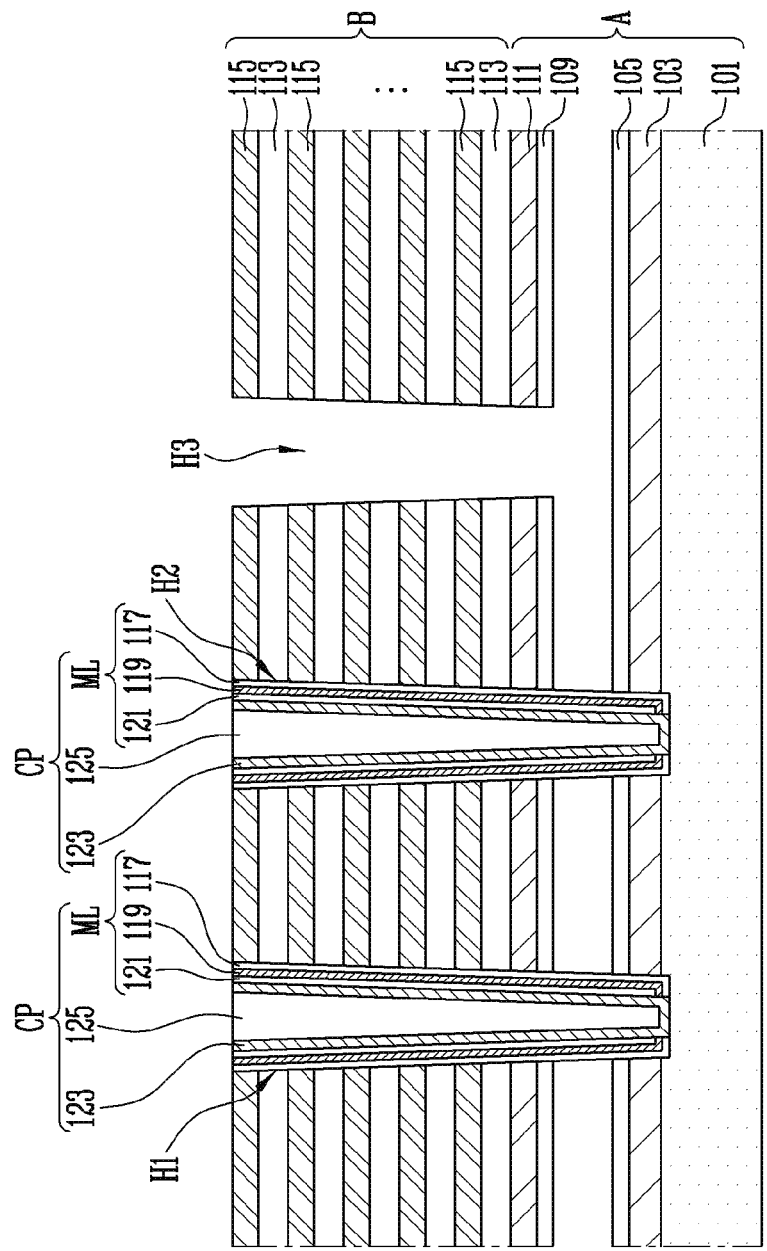

Referring to FIG. 3D, a second source contact hole H3 is formed through an etching process. The second source contact hole H3 is formed to pass through the second stack structure B, the etch stop layer 111 and the second buffer layer 109 and expose the sacrificial layer 107.

Thereafter, the exposed sacrificial layer 107 is removed to form a space in which a conductive layer for a second source line is to be formed. When the sacrificial layer 107 is removed, a lower portion of the sidewall of each channel plug CP is exposed. In other words, a lower portion of the tunnel insulating layer 117 of the channel plug CP is exposed.

Figure 3E:
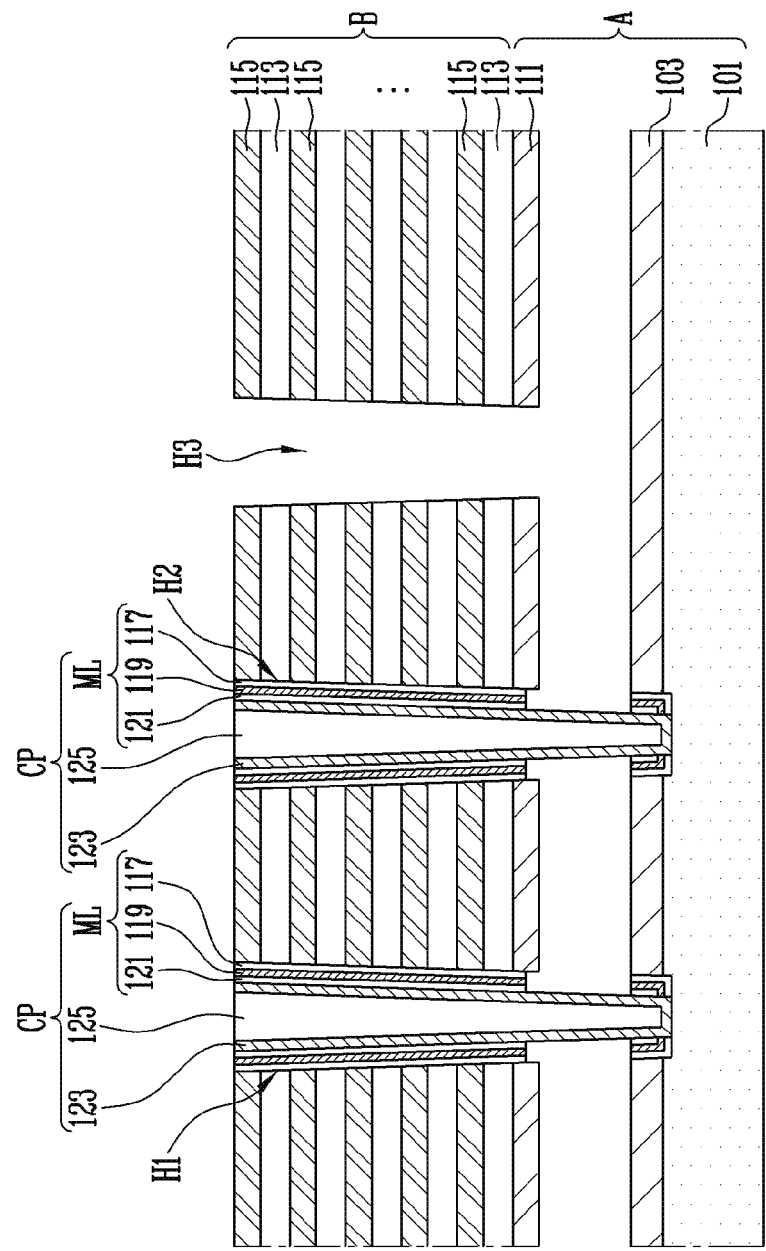

Referring to FIG. 3E, the exposed portions of the tunnel insulating layer 117, the data storage layer 119 and the blocking insulating layer 121 are removed through an etching process, whereby a portion of the channel layer 123 is exposed. During a process of etching the tunnel insulating layer 117, the second buffer layer 109 may be removed, and during a process of etching the data storage layer 119, the first buffer layer 105 may be removed. Here, the tunnel insulating layer 117, the data storage layer 119 and the blocking insulating layer 121 may be further etched upward from the exposed portions thereof. Consequently, the tunnel insulating layer 117, the data storage layer 119 and the blocking insulating layer 121 may be etched to a position higher than the space that is formed by removing the sacrificial layer 107 as described in FIG. 3D. Therefore, the space in which the conductive layer for the second source line is to be formed may protrude a predetermined height upward at a position at which the space comes into contact with the channel layer 123.

Figure 3F:
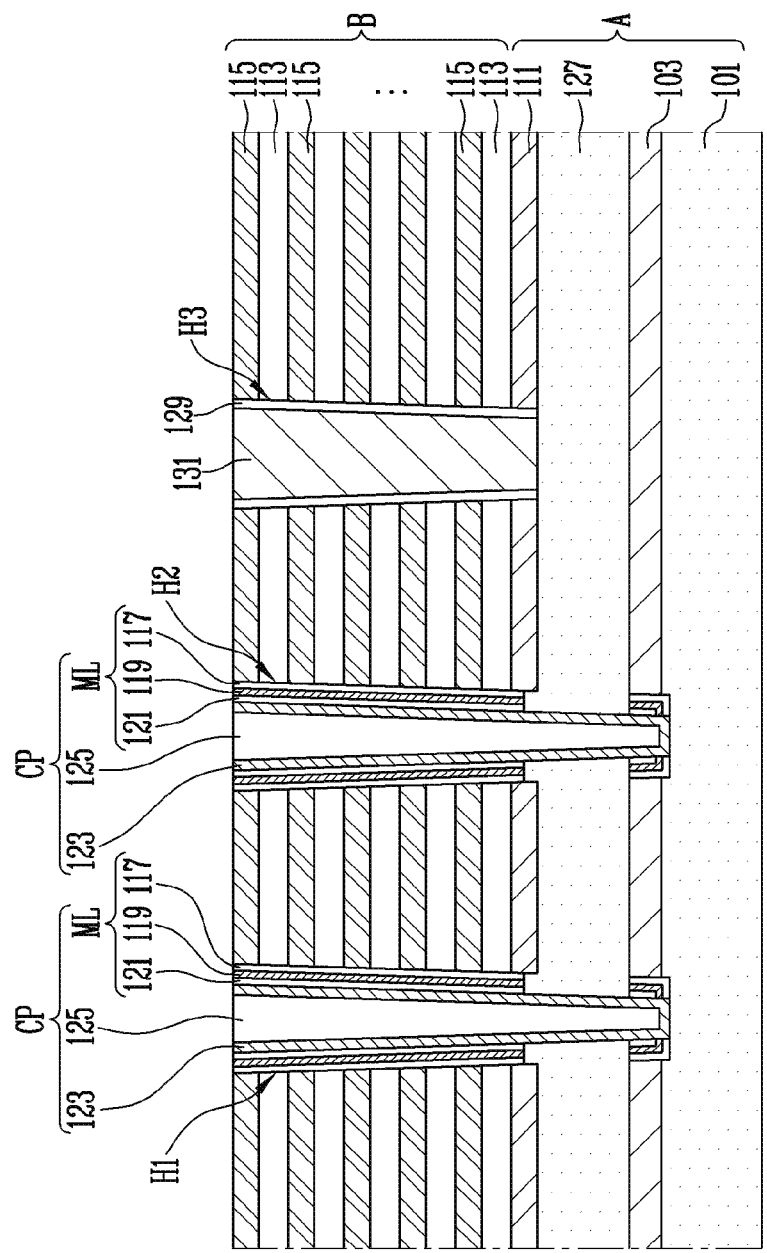

Referring to FIG. 3F, a second conductive layer 127 for the second source line is formed in the space from which the sacrificial layer has been removed. The second conductive layer 127 may be formed of an undoped polysilicon layer or a polysilicon layer doped with an N-type impurity. The second conductive layer 127 is electrically and physically coupled with the channel layer 123. The portion of the second conductive layer 127 that comes into contact with the channel layer 123 may protrude a predetermined height upward. For example, the thickness of the portion of the second conductive layer 127 that comes into contact with the channel layer 123 may be greater than that of the portion of the second conductive layer 127 that is formed between the separation layer 103 and the etch stop layer 111. In an embodiment, for example, a thickness of a region of the auxiliary source line layer SL2 that comes into contact with each of the channel layers 123 is greater than a thickness of the other regions of the auxiliary source line layer SL2. In an embodiment, for example, a thickness of a region of the auxiliary source line layer SL2 between the first multilayer pattern ML1 and the second multilayer pattern ML2 is greater than a thickness of the auxiliary source line layer SL2 outside the region between the first multilayer pattern ML1 and the second multilayer pattern ML2. In an embodiment, for example, a thickness of a region of the auxiliary source line layer SL2 between the etch stop layer 11 and the separation layer 103 may be narrower than a thickness of a region of the auxiliary source line layer SL2 between the first multilayer pattern ML1 and the second multilayer pattern ML2. In an embodiment, for example, a thickness of a region of the auxiliary source line layer SL2 between the etch stop layer 11 and the separation layer 103 may be narrower than a thickness of a region of the auxiliary source line layer SL2 that comes into contact with each of the channel layers 123.

Thereafter, an insulating layer 129 is formed on the sidewall of the second source contact hole H3, and the second source contact hole H3 is filled with a conductive layer to form a second source contact plug 131.

Figure 3G:
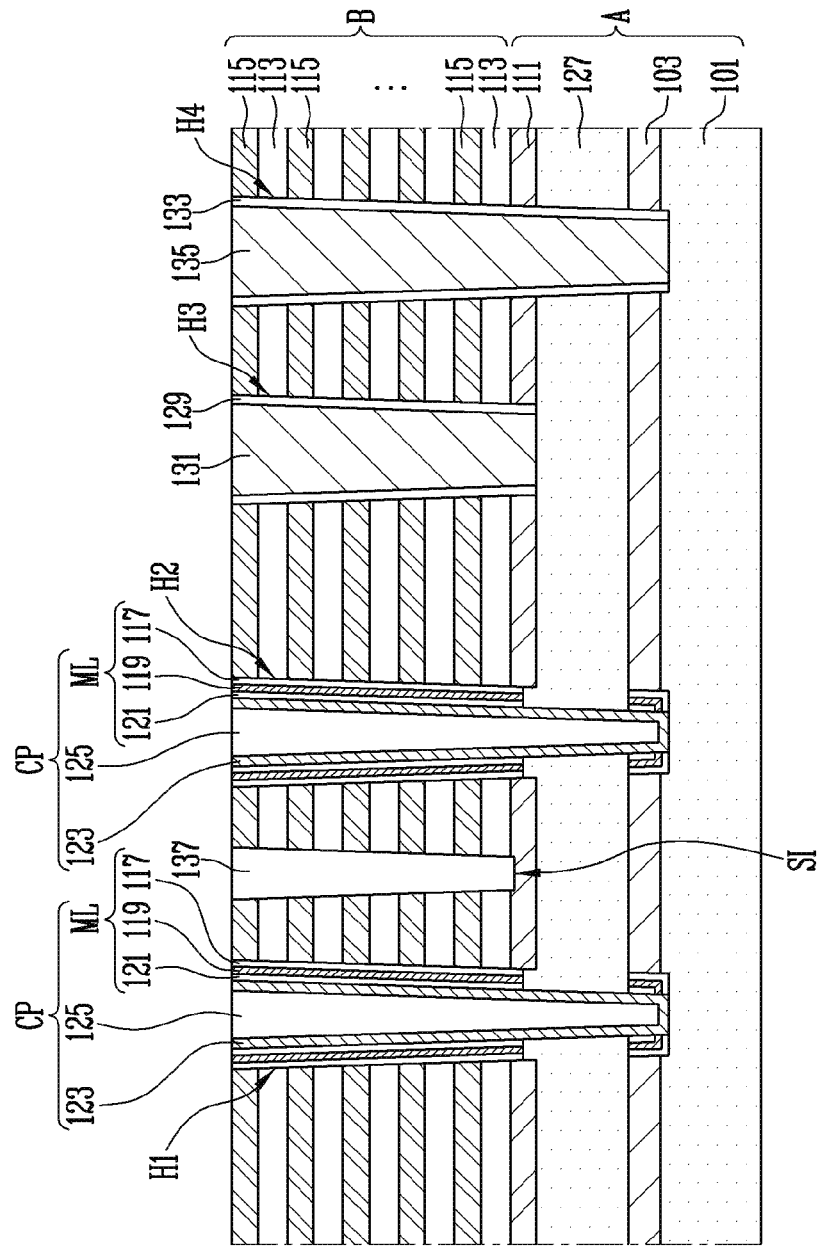

Referring to FIG. 3G, a first source contact hole H4 is formed through an etching process. The first source contact hole H4 is formed to pass through the second stack structure B, the etch stop layer 111 and the second conductive layer 127 and expose a portion of the first conductive layer 101. The first source contact hole H4 may be formed such that a portion of the first conductive layer 101 is etched.

Thereafter, an insulating layer 133 is formed on the sidewall of the first source contact hole H4, and the first source contact hole H4 is filled with a conductive layer to form a first source contact plug 135. The first source contact plug 135 may extend into the first conductive layer 101 by a predetermined depth. In other words, the first source contact plug 135 may pass through a predetermined thickness of the first conductive layer 101.

Figure 3H:
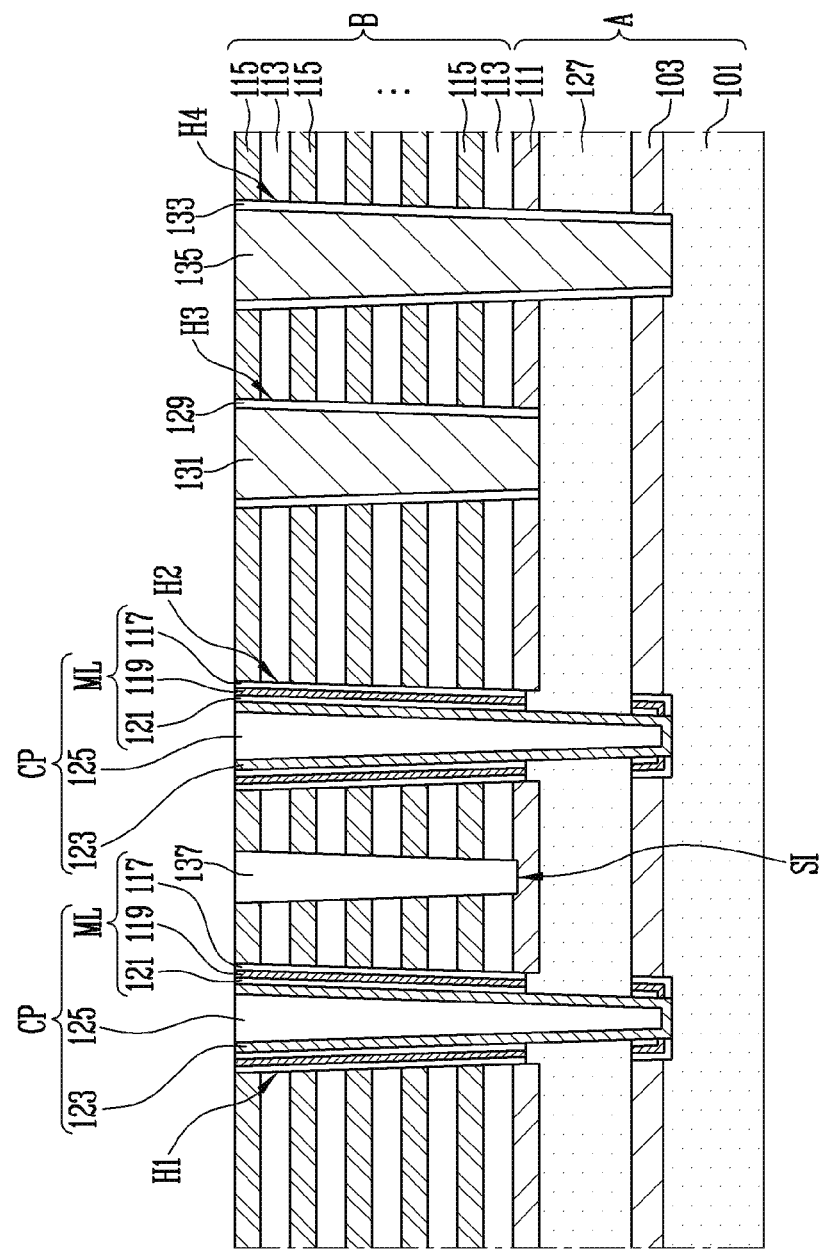

Referring to FIG. 3H, a slit SI is formed to pass through the first and second material layers 113 and 115 by etching a portion of the first and second material layers 113 and 115 between the channel plugs CP. During an etching process for forming the slit SI, due to the etch stop layer 111, the second conductive layer 127 disposed under the etch stop layer 111 is prevented from being damaged.

Thereafter, the slit SI is filled with insulating material to form a slit insulating layer 137.

In the case where the first material layers 113 are formed of insulating material for interlayer insulating layers and the second material layers 115 are formed of sacrificial insulating material, before the slit insulating layer 137 is formed after the slit SI has been formed, the second material layers 115 may be selectively removed through the slit SI to open conductive pattern regions, and then conductive patterns may be formed by filling the conductive pattern regions with conductive material.

Figure 4:
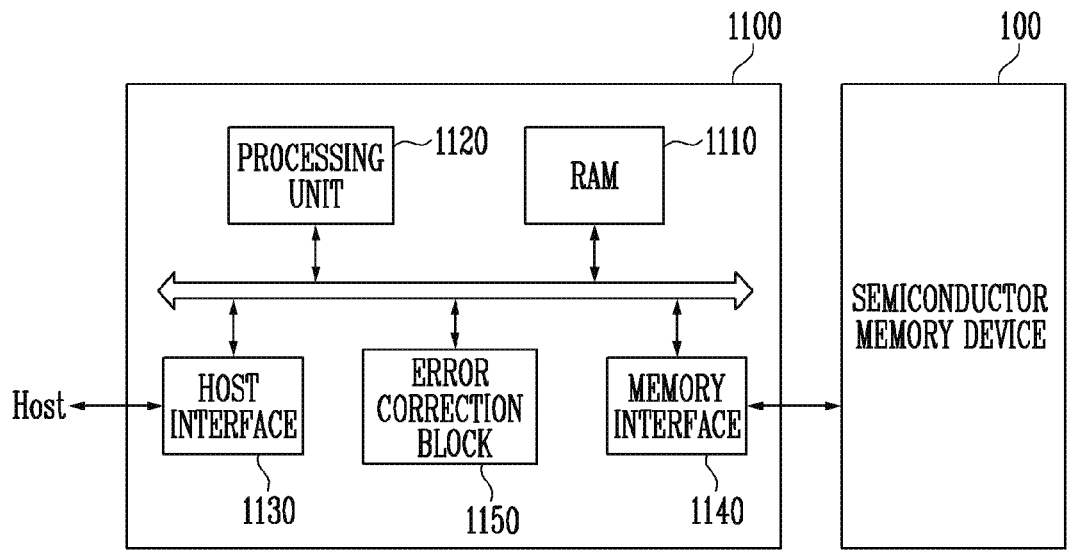
FIG. 4 is a block diagram illustrating a memory system including a semiconductor device in accordance with an embodiment of the present disclosure.

FIG. 4 is a block diagram illustrating a memory system 1000 including a semiconductor memory device 100 in accordance with an embodiment of the present disclosure.

Referring to FIG. 4, the memory system 1000 includes a controller 1100 and a semiconductor memory device 100. The semiconductor memory device 100 may include the semiconductor devices described with reference to FIGS. 1 and 2, and may employ the semiconductor devices realized by the methods of manufacturing the semiconductor devices described with reference to FIGS. 3A to 3H.

The semiconductor memory device 100 may include and operate a memory cell array including the memory strings described with reference to FIGS. 1 and 2. Consequently, the memory strings of the memory cell array included in the semiconductor memory device 100 are coupled in parallel to the first source line and the second source line. An erase voltage may be applied to the first source line during an erase operation. An operating voltage (e.g., a ground voltage) may be applied to the second source line during a program verify operation, an erase verify operation or a read operation. Hereinafter, repetitive explanations will be omitted.

The controller 1100 may be coupled to a host Host and the semiconductor memory device 100. The controller 1100 is configured to access the semiconductor memory device 100 in response to a request from the host Host. For example, the controller 1100 may control read, write, erase, and background operations of the semiconductor memory device 100. The controller 1100 may provide an interface between the host Host and the semiconductor memory device 100. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host.

The host interface 1130 may include a protocol for performing data exchange between the host Host and the controller 1100. In an example of an embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or a NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an example of an embodiment, the error correction block 1150 may be provided as an element of the controller 1100.

The controller 1100 and the semiconductor memory device 100 may be integrated into a single semiconductor device. In an example of an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 5:
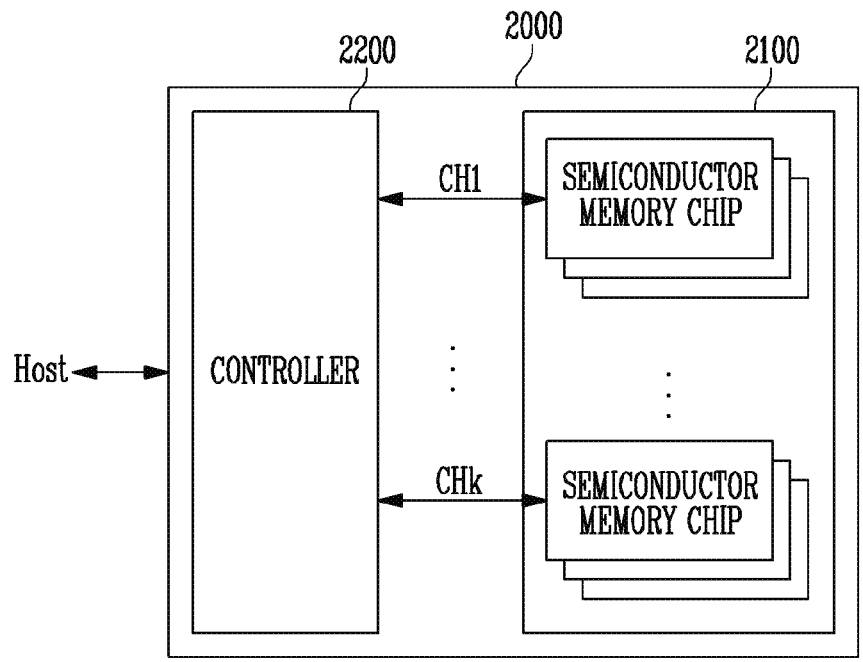
FIG. 5 is a block diagram illustrating an example of application of the memory system of FIG. 4.

FIG. 5 is a block diagram illustrating an example of application of the memory system of FIG. 4. Referring FIG. 5, a memory system 2000 includes semiconductor devices 2100 and a controller 2200. The semiconductor memory device 2100 may include a plurality of memory chips. The semiconductor memory chips are divided into a plurality of groups.

In FIG. 5, it is illustrated that each of the plurality of groups communicates with the controller 2200 through first to k-th channels CH1 to CHk. Each semiconductor memory chip may include the memory strings described with reference to FIGS. 1 and 2, and the memory cell array including the memory strings. Each semiconductor memory chip may include the semiconductor devices described with reference to FIGS. 1 and 2, and may employ the semiconductor devices realized by the methods of manufacturing the semiconductor devices described with reference to FIGS. 3A to 3H.

Each group communicates with the controller 2200 through one common channel. The controller 2200 has the same configuration as that of the controller 1100 described with reference to FIG. 4 and is configured to control a plurality of memory chips of the semiconductor memory device 2100 through the plurality of channels CH1 to CHk.

Figure 6:
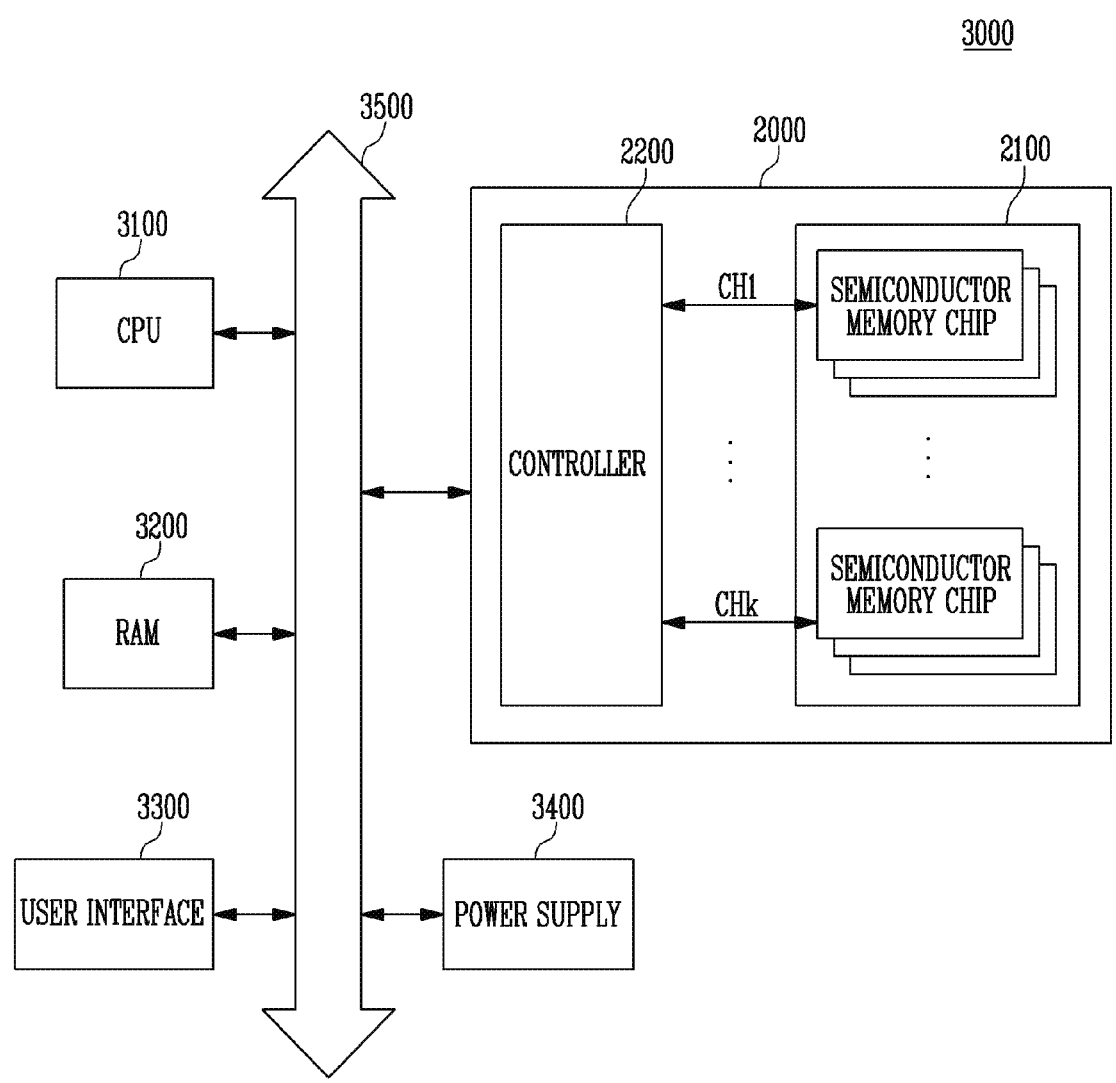
FIG. 6 is a block diagram illustrating a computing system including the memory system illustrated with reference to FIG. 5.

FIG. 6 is a block diagram illustrating a computing system 3000 including the memory system 2000 illustrated with reference to FIG. 5.

Referring to FIG. 6, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 6, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 6, the memory system 2000 described with reference to FIG. 5 may be provided. However, the memory system 2000 may be replaced with the memory system 1000 described with reference to FIG. 4. In an embodiment, the computing system 3000 may include all of the memory systems 1000 and 2000 described with reference to FIGS. 4 and 5.

In a three-dimensional semiconductor device according to the technique of the present disclosure, a source line coupled to memory strings is divided into a source line for a program operation or a read operation and a source line for an erase operation, so that electrical characteristics of each operation may be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, comprising:
   successively stacking and forming, on a semiconductor substrate, a first conductive layer for a first source line, a separation layer, a sacrificial layer, an etch stop layer and a plurality of first and second material layers;
   etching the first material layers, the second material layers, the etch stop layer, the sacrificial layer and the separation layer and forming a plurality of channel holes through which portions of the first conductive layer are exposed;
   forming channel plugs by successively stacking a multilayer layer and a channel layer on inner sidewalls of the channel holes;
   etching a bottom of each of the channel holes to expose the first conductive layer, and additionally forming the channel layer on the bottom of each of the channel holes such that the first conductive layer comes into contact with the channel layer;
   etching the first material layers, the second material layers, the etch stop layer and forming a second source contact hole through which the sacrificial layer is exposed;
   exposing a portion of a sidewall of a lower portion of each of the channel plugs by removing the exposed sacrificial layer; and
   exposing a portion of the channel layer by removing the multilayer layer of the exposed lower portion of each of the channel plugs, and filling a region from which the sacrificial layer has been removed with a second conductive layer for a second source line such that the second conductive layer comes into contact with the channel layer.

2. The method according to claim 1, further comprising, after the second conductive layer is formed, forming a second source contact plug by filling the second source contact hole with conductive material.

3. The method according to claim 1, further comprising:
   after the second conductive layer is formed, etching the first material layers, the second material layers, the etch stop layer, the second conductive layer and the separation layer, and forming a first source contact hole through which the first conductive layer is exposed; and
   forming a first source contact plug by filling the first source contact hole with conductive material.

4. The method according to claim 3, wherein the first source contact plug passes through a predetermined thickness of the first conductive layer.

5. The method according to claim 1, wherein the first conductive layer is formed of a conductive layer doped with a P-type impurity.

6. The method according to claim 1, wherein the second conductive layer is formed of a conductive layer doped with an N-type impurity or an undoped conductive layer.

7. The method according to claim 1, further comprising,
after the separation layer is formed, forming a first buffer layer on the separation layer before the sacrificial layer is formed; and
after the sacrificial layer is formed, forming a second buffer layer on the sacrificial layer before the etch stop layer is formed.

8. The method according to claim 1, wherein the exposing of the portion of the channel layer by removing the multilayer layer comprises etching the multilayer layer upward to a region higher than a region through which the channel layer is exposed.

9. The method according to claim 1, wherein a thickness of a region of the second conductive layer that comes into contact with the channel layer is greater than a thickness of an other region of the second conductive layer.

10. The method according to claim 1, wherein a region of the second conductive layer that comes into contact with the channel layer protrudes upward.

11. The method according to claim 1,
wherein the multilayer layer is divided into a first multilayer pattern and a second multilayer pattern based on a region in which the second conductive layer comes into contact with the channel layer, and
wherein a thickness of a region of the second conductive layer between the first multilayer pattern and the second multilayer pattern is greater than a thickness outside the region between the first multilayer pattern and the second multilayer pattern.

* * * * *

UNITED STATES PATENT AND TRADEMARK OFFICE
CERTIFICATE OF CORRECTION

| | | |
|---|---|---|
| PATENT NO. | : 10,644,029 B1 | Page 1 of 1 |
| APPLICATION NO. | : 16/721740 | |
| DATED | : May 5, 2020 | |
| INVENTOR(S) | : In Su Park and Dong Sun Sheen | |

It is certified that error appears in the above-identified patent and that said Letters Patent is hereby corrected as shown below:

On the Title Page

Item (71) Applicant:
Replace "SK hynix Inc., Incheon-si, Gyeonggi-do (KR)" with --SK hynix Inc., Icheon-si, Gyeonggi-do (KR)--

Signed and Sealed this
Twenty-fifth Day of August, 2020

Andrei Iancu
*Director of the United States Patent and Trademark Office*